(12) United States Patent
Huang et al.

(10) Patent No.: US 10,306,796 B2
(45) Date of Patent: May 28, 2019

(54) INFORMATION HANDLING SYSTEM RAIL CLIP AUTOMATIC CLAMPING

(71) Applicant: Dell Products L.P., Round Rock, TX (US)

(72) Inventors: Hou Chun Huang, Austin, TX (US); Todd D. Grabbe, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 3 days.

(21) Appl. No.: 15/800,258

(22) Filed: Nov. 1, 2017

(65) Prior Publication Data
US 2019/0132984 A1   May 2, 2019

(51) Int. Cl.
| H05K 7/00 | (2006.01) |
| H05K 7/14 | (2006.01) |
| G06F 1/18 | (2006.01) |
| H05K 13/04 | (2006.01) |
| H05K 7/18 | (2006.01) |

(52) U.S. Cl.
CPC .......... *H05K 7/1489* (2013.01); *G06F 1/181* (2013.01); *G06F 1/183* (2013.01); *H05K 7/183* (2013.01); *H05K 13/04* (2013.01)

(58) Field of Classification Search
None
See application file for complete search history.

(56) References Cited

U.S. PATENT DOCUMENTS

| 5,904,592 | A | * | 5/1999 | Baran | H02B 1/052 361/627 |
| 6,038,130 | A | * | 3/2000 | Boeck | H01R 9/2675 361/729 |
| 6,431,909 | B1 | * | 8/2002 | Nolden | H01R 9/2608 361/735 |
| 7,073,971 | B2 | * | 7/2006 | Schurr | H02B 1/052 403/325 |
| 7,869,219 | B2 | * | 1/2011 | Ma | G11C 11/5621 361/737 |
| 8,029,303 | B2 | * | 10/2011 | Chiang | H01R 27/00 439/131 |
| 8,403,376 | B2 | * | 3/2013 | Greiner | E05B 47/0012 292/144 |
| 9,137,913 | B2 | * | 9/2015 | Hsu | H05K 5/0221 |
| 9,418,036 | B2 | * | 8/2016 | Xiao | G06F 13/409 |
| 2007/0015407 | A1 | * | 1/2007 | Loftus | H01R 13/4538 439/607.01 |
| 2009/0153002 | A1 | * | 6/2009 | Kinoshita | B60R 11/0205 312/223.1 |

(Continued)

Primary Examiner — Courtney L Smith
Assistant Examiner — Rashen E Morrison
(74) *Attorney, Agent, or Firm* — Zaborin Cave LLP; Robert W. Holland (57) ABSTRACT

An information handling system couples at a location with a rail clip that couples to a rail, such as with a DIN rail system. A sensor detects engagement of the rail clip at the rail and signals extending members that extend outward from the rail clip to press against the rail. At disengagement of the rail clip from the rail, the extending members retract to release the rail for removal of the information handling system. In one embodiment, the sensor and extending members are integrated in the information handling system to support extension and retraction with commands through the information handling system, such as by network communications.

20 Claims, 9 Drawing Sheets

(56) References Cited

U.S. PATENT DOCUMENTS

| | | | |
|---|---|---|---|
| 2010/0233912 A1* | 9/2010 | Chiang | H01R 13/60 |
| | | | 439/638 |
| 2012/0038177 A1* | 2/2012 | Greiner | E05B 47/0012 |
| | | | 292/157 |
| 2016/0050975 A1* | 2/2016 | Worm | A24F 47/008 |
| | | | 131/328 |
| 2017/0099877 A1* | 4/2017 | Worm | A61M 11/042 |
| 2017/0150757 A1* | 6/2017 | Worm | A24F 47/008 |

* cited by examiner

INFORMATION HANDLING SYSTEM RAIL CLIP AUTOMATIC CLAMPING

BACKGROUND OF THE INVENTION

Field of the Invention

The present invention relates in general to the field of information handling system mounting devices, and more particularly to an information handling system rail clip having automatic clamping.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems manage information in large and small scale scenarios. Large data centers typically aggregate information in the "cloud" where virtual machines work to organize, analyze and apply the information. Artificial intelligence has become a powerful tool for analyzing large scale "big data" from multiple small sources to find and address real world trends. One key to obtaining usable results from artificial intelligence or other big data analysis is to have a large quantity of accurate data for analysis. The Internet of Things (IoT) has become one avenue for gathering relevant and accurate data. IoT devices include relatively simple processing resources, networking sources and sensors that gather and report sensed conditions to data center. By distributing IoT devices through a facility to monitor temperatures, accelerations, light, humidity and other conditions, facilities gather detailed information available for analysis to improve facility operations.

One difficulty with implementing IoT devices in a facility is that the information gathered by sensors has to be communicated to a central location in a cost effective manner. Typically sensors operate in low power modes to intermittently report sensed conditions to local "hub" devices. The hub devices typically receive the intermittent reports, such as with a Bluetooth Low Energy interface, and then forward the data through a wireless local area network interface to the Internet and a cloud network location. Distributed IoT hubs typically are headless devices having hardened housings that are placed in out-of-place locations that have good wireless access. One way to distribute IoT devices and hubs is to couple a "DIN" rail in a desired location and then couple the IoT devices to the DIN rail with a DIN rail clip. DIN rails and similar coupling architectures provide a relatively simple attachment process in which the clip fits over an upper part of the rail and then rotates to couple to a lower part of the rail. Removal is accomplished with a reversal of the attachment process in which the clip releases from the lower part of the rail and then rotates to release from the upper part of the rail. Often a spring is included in the rail to bias the clip into a coupled position with the lower part of the rail.

One difficulty that can arise with the use of DIN rails is that some clips and rails have variations in the size of the coupling portions. For example, in some instances DIN rail clips have 1.0 mm spacing and in some instances DIN rail clips have 1.5 mm spacing. If a 1.5 mm clip couples to a 1.0 mm rail, the loose fit sometimes results in disengagement of the clip and rail so that the IoT device falls. Although more secure coupling techniques are available, such techniques tend to be more difficult to implement and time consuming when interacting with installed devices.

SUMMARY OF THE INVENTION

Therefore, a need has arisen for a system and method which adapts a rail clip to a rail having variance in size at the coupling location.

In accordance with the present invention, a system and method are provided which substantially reduce the disadvantages and problems associated with previous methods and systems for coupling a rail clip to a rail. A sensor detects engagement of the rail clip at the rail to send a signal that extends extending members from the rail clip towards the rail. The extending members press against the rail to restrict movement of the rail clip relative to the rail More specifically, an information handling system processes information at a physical location with processing components disposed in a housing. A rail clip coupled to the information handling system housing is configured to couple with a rail at the location to hold the information handling system in place. A sensor disposed in the rail clip detects engagement of the rail clip at the rail and signals one or more extending members disposed in the rail clip to extend out against the rail to secure the rail clip on the rail. Upon disengagement of the rail clip sensor from the rail, a signal to the extending members results in retraction so that the rail clip separates from the rail, easing release of the information handling system from the physical location. In one alternative embodiment, the sensor and extending members integrate in the information handling system at the rail clip location with access provided by openings in the rail clip. For example the extending members are actuated in part with permissions provided by the information handling system to offer a physical lock of the housing at the rail.

The present invention provides a. number of important technical advantages. One example of an important technical advantage is that an information handling system housing securely couples with a rail clip to a rail at a physical location with variance between rail and rail clip dimensions adjusted by engagement of the extending members at the rail. For example, a rail clip having 2.0 mm of spacing at an upper support, portion securely engages with a 1.0 min thick rail when extending members press against the rail from the rail clip, essentially selectively reducing the size of the rail clip spacing once engagement of the rail clip and rail are sensed. In one embodiment, by having the extending members controlled at least in part by the information handling system, a lock is provided by engaging the extending members into an opening formed in the rail.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Information handling systems securely couple with a rail dip engaged to a rail having variable clearances by detecting engagement and extending members to restrict movement. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
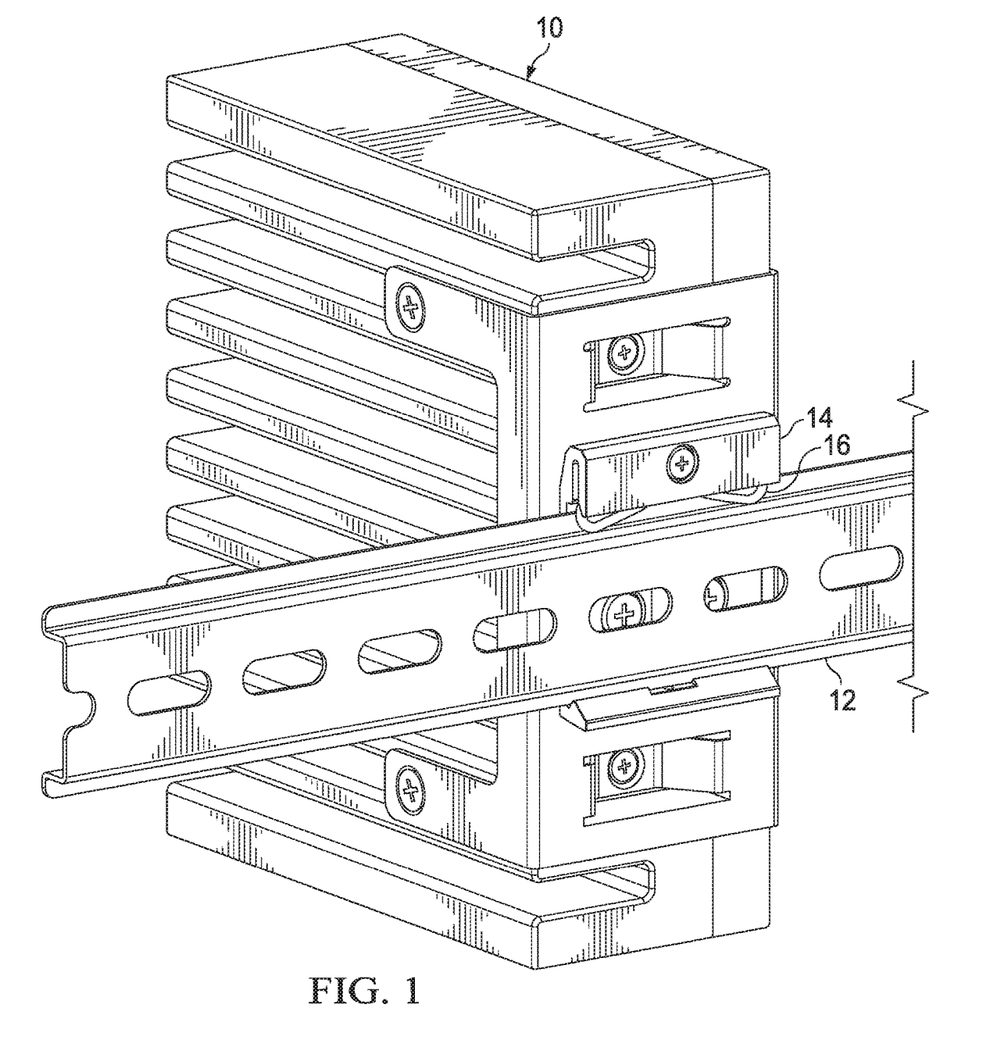
FIG. 1 depicts a rear perspective view of an information handling system rail clip coupled to a rail.

Referring now to FIG. 1, a rear perspective view depicts an information handling system 10 rail clip 14 coupled to a rail 12. Information handling system 10 is, for example, a headless IoT hub deployed in a field location to monitor sensors through wireless communication. Rail 12 is, for example, a standard sized DIN rail having 1.0 mm thick upper and lower portions that fit into and engage corresponding structures in clip 14. A spring 16 extending from the upper portion of clip 14 presses against rail 12 to bias the lower portion of rail 12 into the lower portion of clip 14. In various embodiments, rail 12 may having varying thicknesses so that the structures of clip 14 have to vary in size to accept the greatest expected rail thickness. In some situations, excess space within clip 14 needed to have room for the most thick expected rail results in an insecure and loose fit if a thinner rail is coupled to clip 14.

Figure 2A:
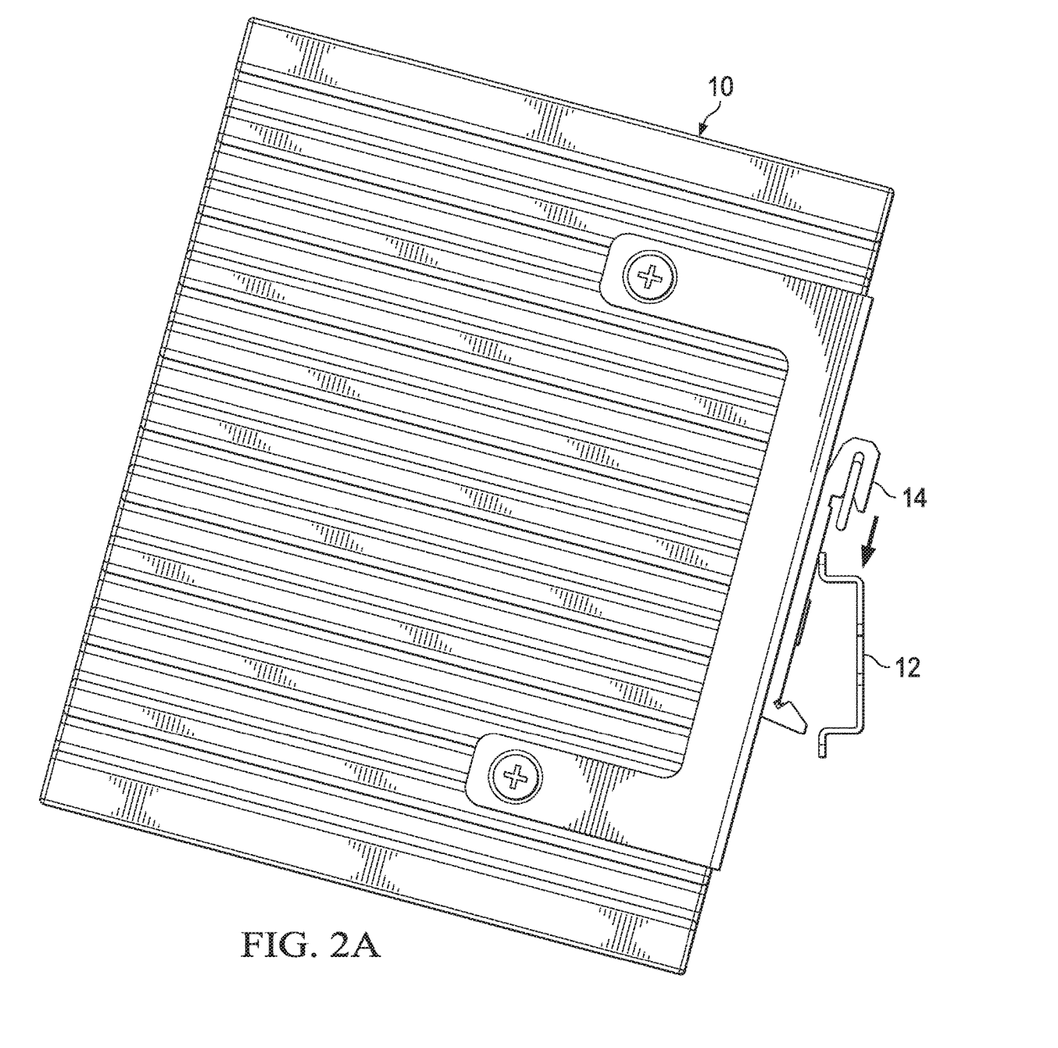
FIGS. 2A, 2B and 2C, depict installation of an information handling system rail clip onto a. rail.
Figure 2B:
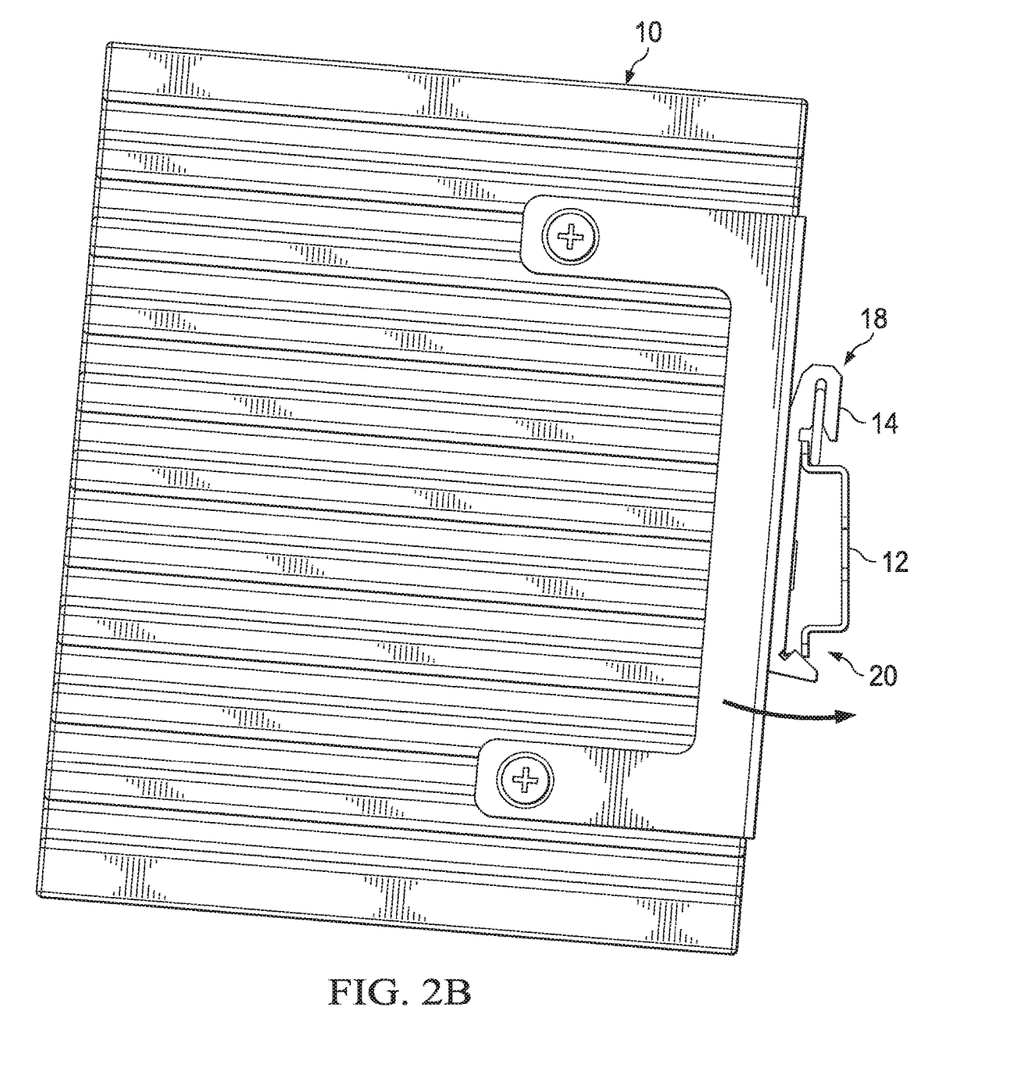
Figure 2C:
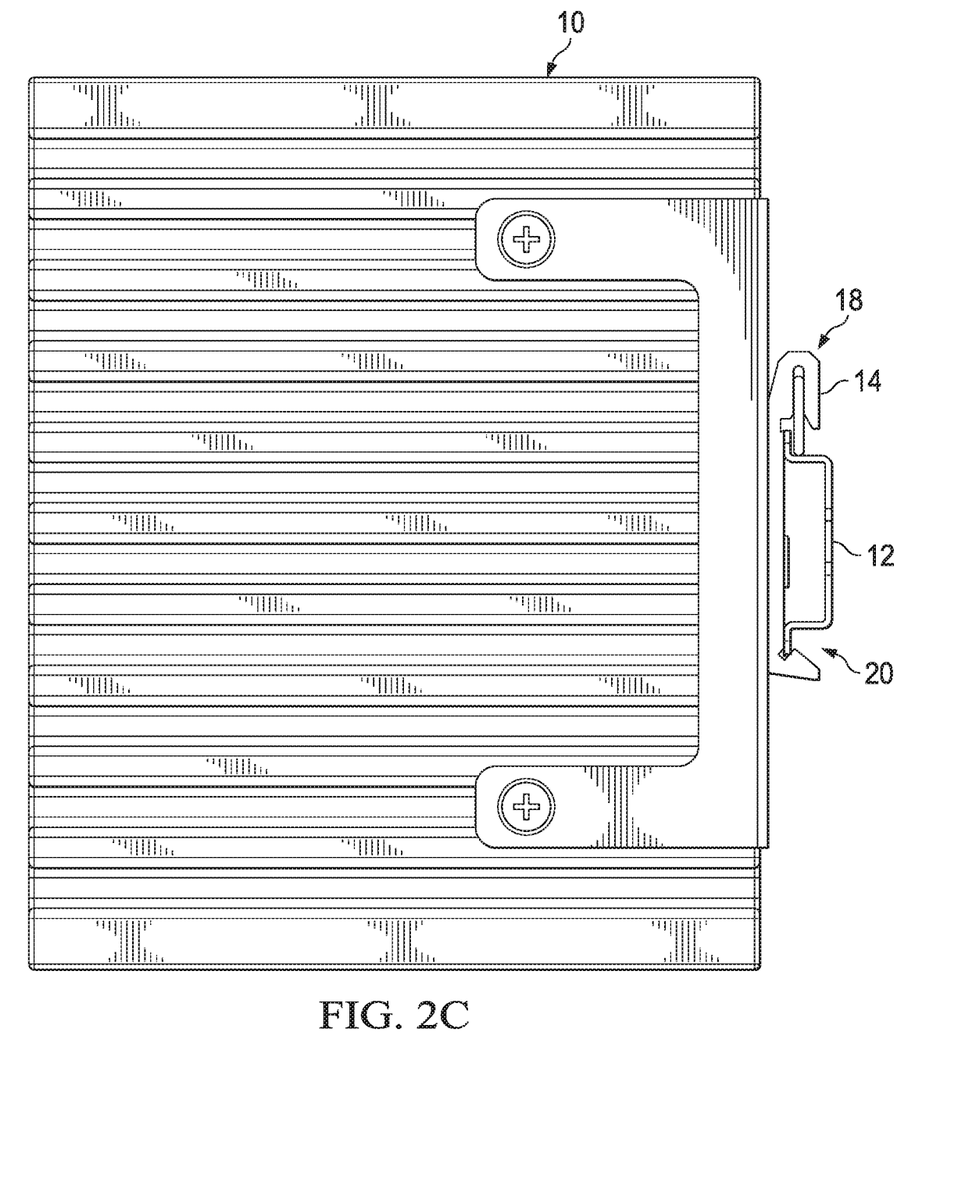

Referring now to FIGS. 2A, 2B and 2C, installation of an information handling system rail clip onto a rail is depicted. Initially, upper portions 18 of rail 12 and clip 14 are engaged with an upward push that compresses spring 16, as depicted by FIG. 2A. FIG. 2B depicts that compression of spring 16 provides room to rotate rail 12 and clip 14 lower portions 20 in alignment with each other. Once lower portions 20 are aligned, clip 14 secures to rail 12 by releasing pressure on spring 16 to allow a downward bias that forces the lower portion 20 of rail 12 to engage in the stricture at the lower portion 20 of clip 14. Removal of information handling system 10 from its mounted position is performed with the opposite steps of pushing up against spring 16 to create space for rotation of lower portions 20 of rail 12 out of clip 14. Once lower portions 20 are clear of each other, information handling system 10 is lifted upward and away from rail 12 to clear upper portions 18 of clip 14 from rail 12. Rapid and accurate coupling and removal of information handling systems to rail 12 provides information technology professionals with a convenient structure for distributing information handling systems 10 through a location, however, excessive spacing related to rail thickness and clip structure can result in excessive movement of a mounted information handling system including, in extreme cases, failure of the mount to hold the information handling system.

Figure 3:
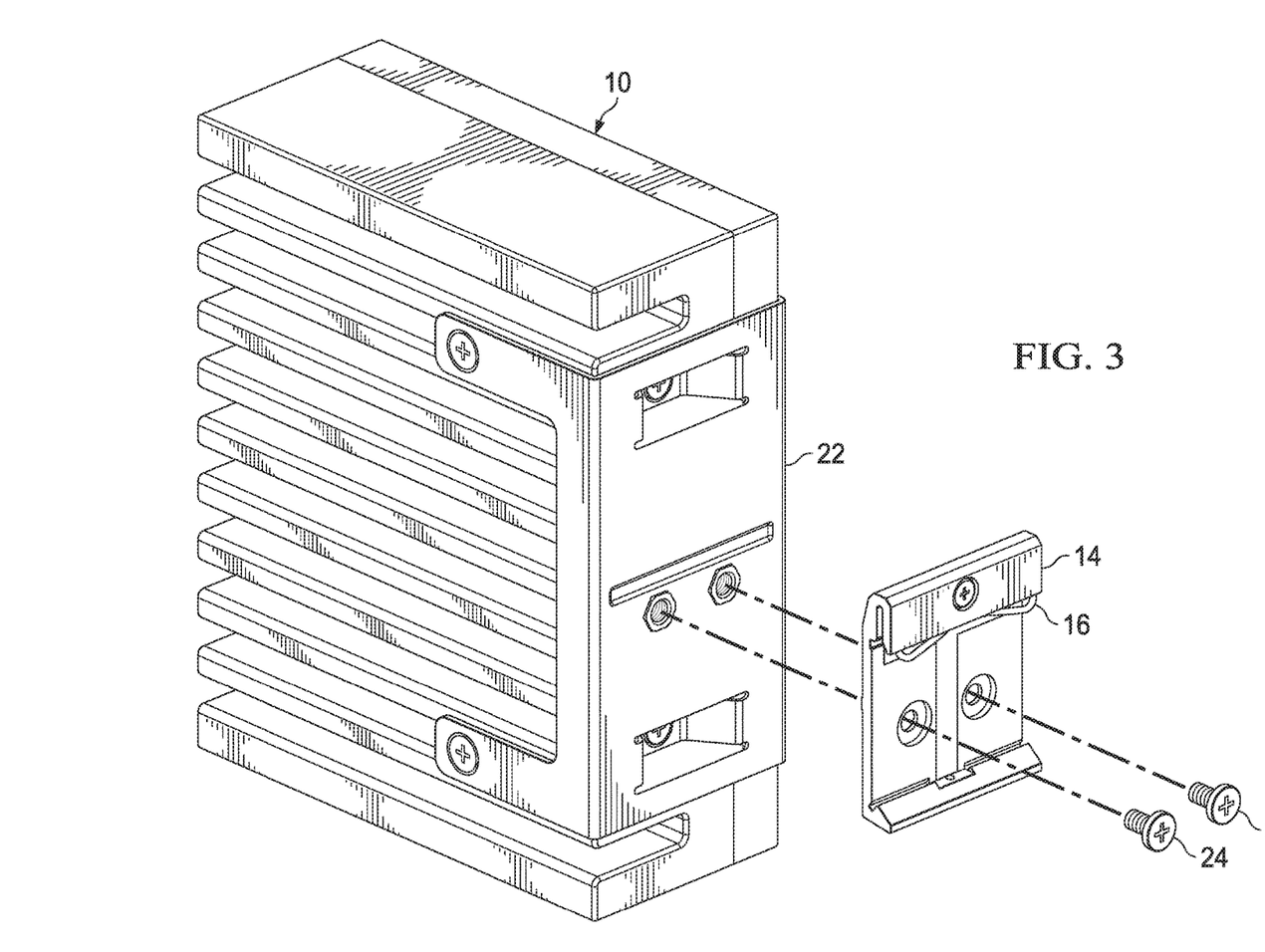
FIG. 3 depicts a perspective exploded view of a rail clip aligned to couple to an information handling system perpendicular mount.

Referring now to FIG. 3, a perspective exploded view depicts a rail clip 14 aligned to couple to an information handling system 10 perpendicular mount 22. Mount 22 has two screw openings that screws 24 couple to through clip 14 to secure clip 14 to information handling system 10. In an alternative embodiment, sensors and actuators may be included in mount 22 or information handling system 10 and accessible under mount 22 to provide the tightening features described below.

Figure 4:
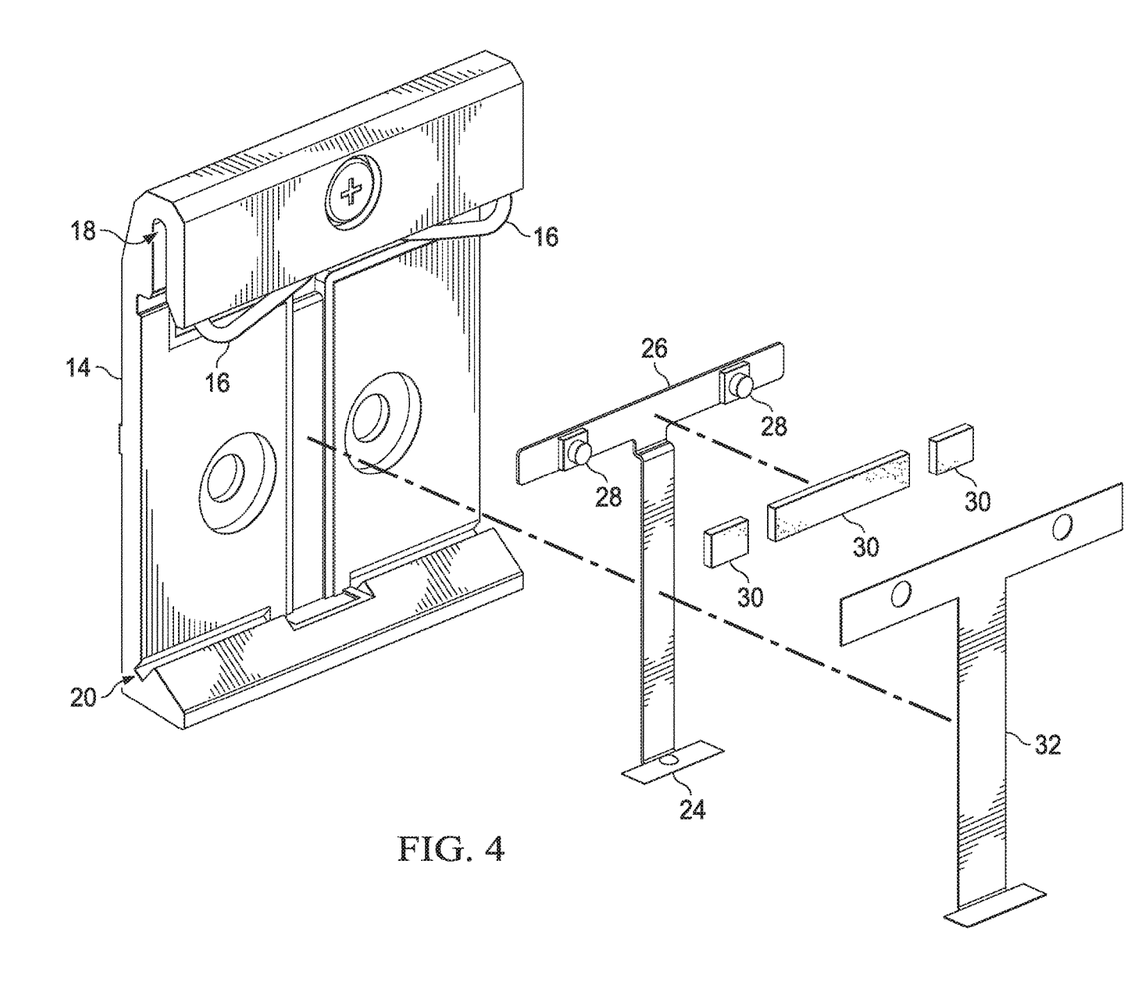
FIG. 4 depicts an exploded view of a rail clip integrating an engagement sensor that signals extending members.

Referring now to FIG. 4, an exploded view depicts rail clip 14 integrating an engagement sensor 34 that signals extending members 28 to selectively engage are release relative to a rail 12. In the example embodiment, clip 14 integrates a flexible printed circuit 26 in a channel to communicate clip and rail engagement between a sensor 34 and extending members 28. A metal dome switch 34 or other sensor integrates in the lower portion 20 of clip 14 with electrical signal continuity to flexible printed circuit 26. When a rail inserts in lower portion 20 of clip 14 and presses against switch 34, switch 34 generates a signal communicated through flexible printed cable 26 to a pair of extending members located at the upper portion 18 of clip 14. For example, extending members 26 are solenoids that have an extended and retracted position. When switch 34 signals engagement with a rail 12, an extension of members 28 causes members 28 to press against the rail 12 upper portion 18 to reduce any excess spacing that may exist within clip 14 after insertion of rail 12. Upon removal of rail 12 from clip 14 and release of switch 34, extending members 28 retract to provide additional room for convenient removal of rail 12 from within clip 14.

In the example embodiment, switch 34 provides current on activation by a rail press and removes the current upon removal of the rail press. An outer layer of Mylar or other insulating material isolates flexible printed circuit from damage during insertion of rails 12 into clip 14. A sponge or other neutral material helps to create a distributed press by extending members 28 against an inserted rail 12. With a constant current, the presence of a rail in clip 14 drives solenoids or other devices to extend outward and engage a rail 12; and the removal of current retracts the solenoids to release rail 12. In alternative embodiments, switch 34 generates a current pulse on detection of a rail and an opposing current pulse on removal of the rail so that a two position solenoid activates to an appropriate position in response to signals sent through flexible printed circuit 26. Other types of detection devices and/or sensors may be used, as may other types of extending member devices.

Figure 5:
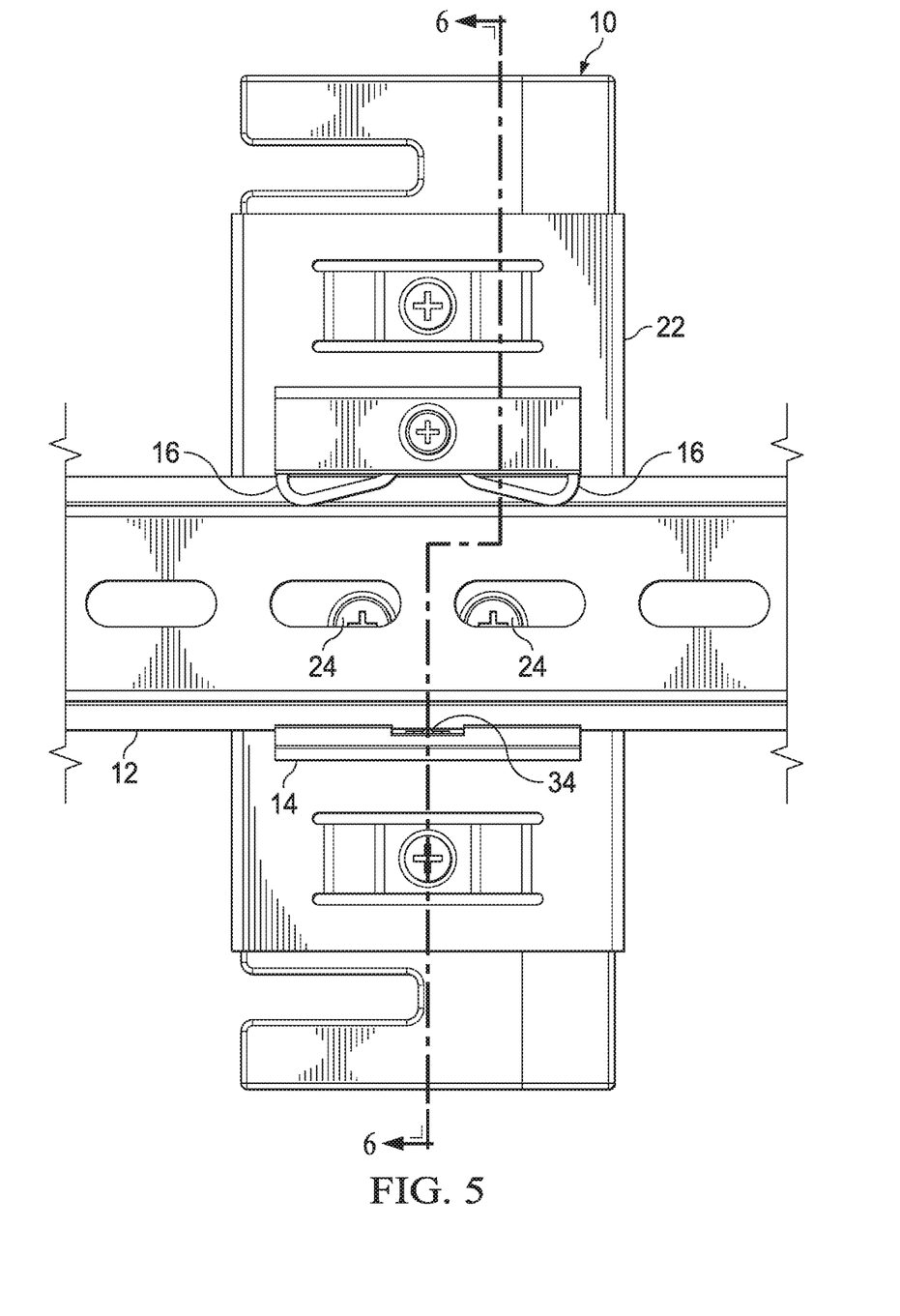
FIG. 5 depicts a rail clip installed on a rail having a cross sectional view defined.

Referring now to FIG. 5, a rail clip 14 is depicted installed on a rail 12 having a cross sectional view defined. In the example, a DIN rail 12 and clip 14 are held in close proximity at a bottom portion 20 by a spring 16 pressing downward on rail 12 from the upper portion 18 of clip 14. Removal of rail 12 from clip 14 is accomplished by pressing upward on rail 12 to compress spring 16, such as by lifting upward on information handling system 10, to release the switch 34 at lower portion 20 of clip 14. As rail 12 lifts off switch 34, extending members 28 retract to release rail 12 within clip 14.

Figure 6:
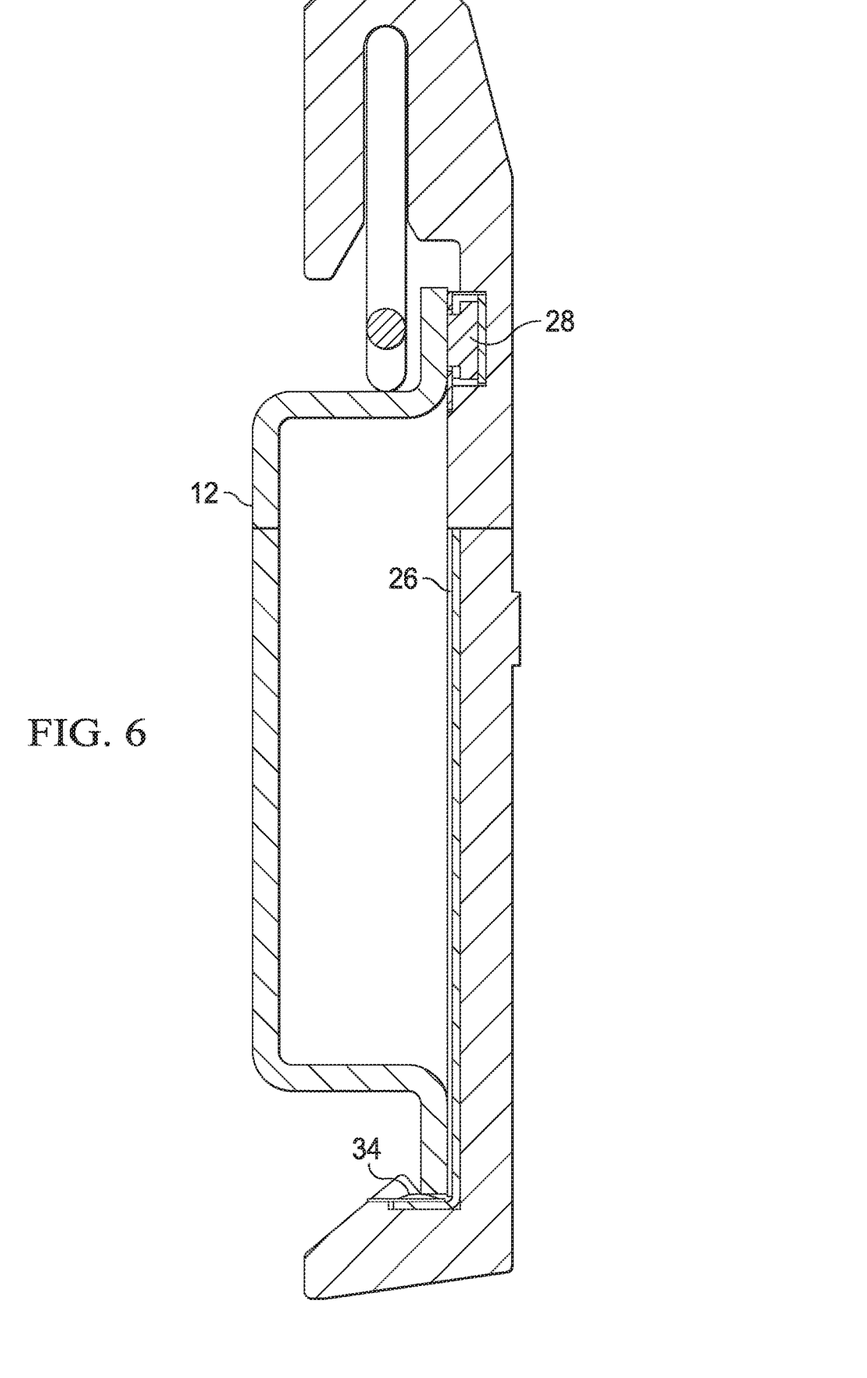
FIG. 6 depicts the cross sectional view show an example of an engagement sensor detecting coupling of the rail clip to the rail to extend the extending member.

Referring now to FIG. 6, the cross sectional view shows an example of an engagement sensor 34 detecting coupling of the rail clip 14 to the rail 12 to extend the extending members 28. Downward relative pressure placed on switch 34 commands extension of extending members 28 to press against rail 12 and enable a secure fit. In the example embodiment, extending members 28 include a spring-biased outward pressure that adapts to rails 12 of different thicknesses. In alternative embodiments, manual activation of a switch may also be included to provide extension and retraction of members 28; however, automated action allows end users to take full advantage of single-handed installation and removal of an information handling system at a rail 12.

Figure 7:
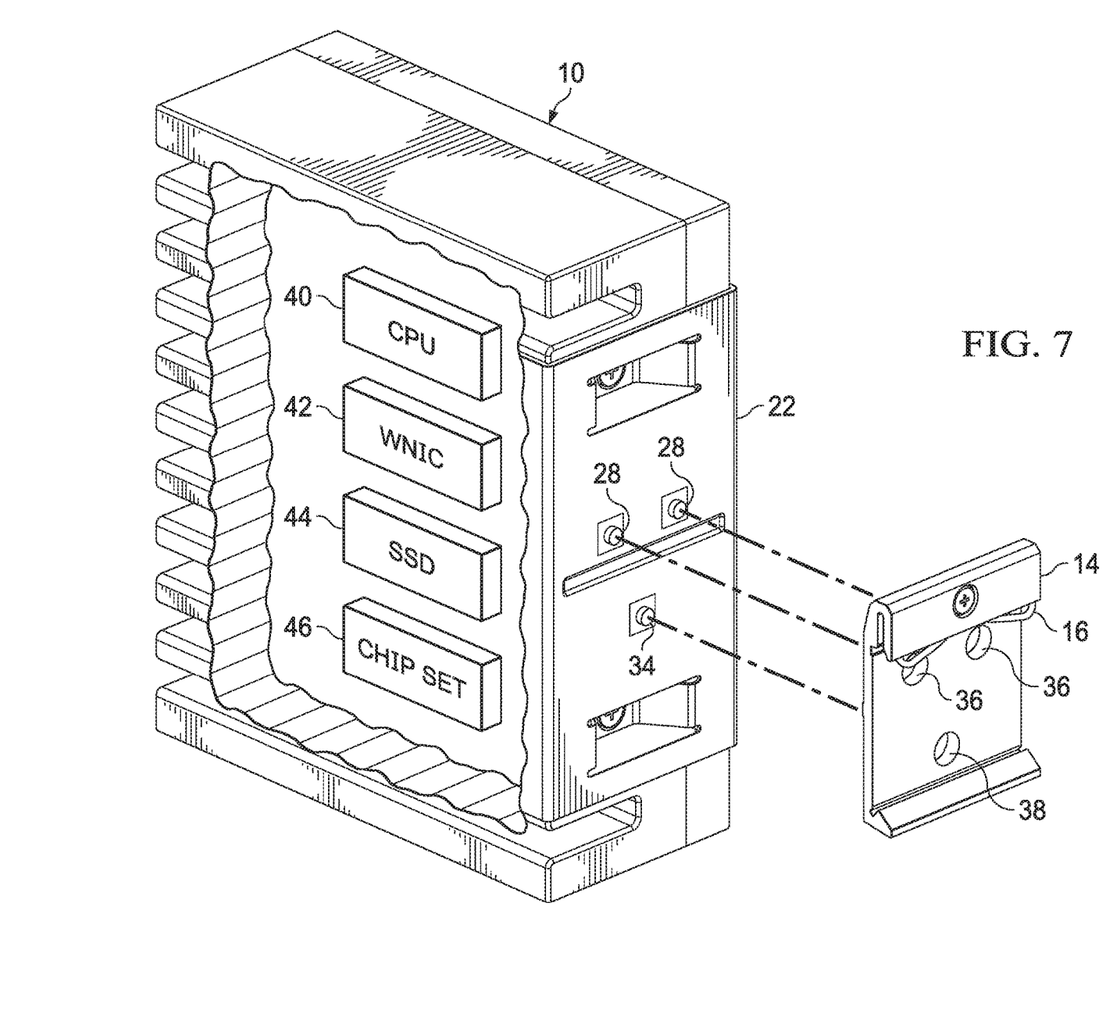
FIG. 7 depicts an information handling system that integrates the engagement sensor and extending members to operate through openings formed in the rail clip.

FIG. 7 depicts an information handling system that integrates the engagement sensor 34 and extending members 28 to operate through openings 36 and 38 formed in the rail clip 14. Information handling system 10 includes processing components that cooperate to process information. In the example embodiment, a central processing unit (CPU) 40 executes instructions stored in memory, such as a solid state drive (SSD) 44, to perform processing functions, such as an IoT hub. For example a wireless network interface card (WNIC) 42 provides wireless communication with sensors, wireless local area networks and other information handling systems. A chipset 46 or similar processing component manages interactions on a physical layer, such as with peripheral devices interfaced to information handling system 10.

At the rail clip 14 mounting location of information handling system 10, chipset 46 interfaces with a switch 34 and first and second extending members 28. Switch 34 enters clip 14 through opening 38 as clip 14 secures to information handling system 10. Extending members 28 enter clip 14 through openings 36 as clip 14 secures to information handling system 10. When clip 14 inserts onto a rail 12, switch 34 detects the presence of rail 12 and reports the presences to chipset 46, such as to an embedded code module executing on chipset 46. Chipset 46 selectively extends and retracts extending members 28 based upon the presence or absence of rail 12 within clip 14. In the example embodiment, extending members 28 are solenoids integrated in information handling system 10 that are commanded to extend and retract directly by chipset 46. In an alternative embodiment, chipset 46 may provide a signal and or power through a physical interface with the flexible printed circuit integrated in clip 14 to extend members integrated in clip 14.

One advantage of integration of extending members 28 into information handling system 10 is that the extension and retraction may be managed by chipset 46. For example, an end user with a portable phone interfaced through WNIC 42 may provide wireless commands to extend or retract members 28 after installation of information handling system 10 on rail 12 and before removal of information handling system 10 from rail 12. In one embodiment, extending members 28 may extend varying amounts based upon settings provided to chipset 46 to adapt to rails and clips of different thicknesses. In one alternative embodiment, extending members 28 may insert through openings of rail 12 to provide a lock that locks information handling system 10 in place and that is released by a wireless command to chipset 46. Switch 34 may be a mechanical switch, or may be other types of detection sensors, such as a Hall switch, and infrared sensor, a MEMS device, etc.

Although the present invention has been described in detail, it should be understood that various changes, substitutions and alterations can be made hereto without departing from the spirit and scope of the invention as defined by the appended claims.

What is claimed is:

1. An information handling system comprising:
processing components disposed in a portable housing;
a rail coupled to fixed location, the rail having upper and lower securing portions;
a clip coupled to the portable housing, the clip having upper and lower securing portions that engage with the rail upper and lower securing portions;
an extending member integrated with the clip and aligned to selectively extend outward to press against the rail; and
a switch integrated with the clip and aligned to press directly against the rail at insertion of the clip onto the rail, the switch activating the extending member to press against the rail.

2. The information handling system of claim 1 further comprising:
a spring integrated with the clip and aligned to press on the rail to bias the rail into the switch;
wherein removal of the rail from pressing on the switch retracts the extending member away from pressing against the rail.

3. The information handling system of claim 2 wherein:
the extending member engages the rail upper securing portion; and
the switch engages the rail lower securing portion.

4. The information handling system of claim 3 wherein the extending member comprises a solenoid having an extended state and a retracted state, the switch sending a current to activate the solenoid to the extended position when the clip lower securing portion engages the rail.

5. The information handling system of claim 4 wherein the switch interfaces with the information handling system for current to activate the solenoid.

6. The information handling system of claim 4 wherein the switch integrates a battery to activate the solenoid.

7. The information handling system of claim 1 further comprising a flexible printed circuit integrated in the clip and communicating an electrical signal from the switch to the extending member.

8. The system of claim 7 wherein the switch comprises a Hall sensor.

9. The system of claim 1 further comprising an interface between the switch and the processing components, the processing components operable to command the switch to retract or extend the extending member.

10. A method for securing an information handling system to a rail, the method comprising: inserting an upper portion of a clip onto the upper portion of the rail, the clip coupled to the information handling system; inserting a lower portion of the clip onto the lower portion of the rail; engaging a switch with the lower portion of the rail, the switch exposed at the lower portion of the clip and engaged by pressing the rail downward against the switch: in response to engaging the switch, sending a signal from the switch to an extending member located at the upper portion of the clip; and in response to the signal, extending the extending member out of the clip to press against the upper portion of the rail.

11. The method of claim 10 further comprising:
removing the lower portion of the clip from the rail;
detecting the removing with the switch;
in response to the detecting, sending a signal from the switch to the extending member; and
in response to the signal, retracting the extending member into the clip to release the upper portion of the rail.

12. The method of claim 11 further comprising sending the signal through a flexible printed circuit integrated in the rail between the switch and the extending member.

13. The method of claim 11 wherein the extending member comprises first and second solenoids.

14. The method of claim 10 wherein the switch is integrated in the information handling system, the clip having an opening that exposes the switch to contact the rail.

15. The method of claim 10 wherein the extending member is integrated in the information handling system, the clip having an opening that exposes the extending member to contact the rail.

16. The method of claim 15 further comprising:
receiving a command at the information handling system to extend the extending member; and
in response to the command, extending the extending member from the information handling system through opening and into contact with the rail.

17. The method of claim 10 wherein receiving the command at the information handling system further comprises receiving the command through a wireless network interface.

18. An information handling system securing system comprising:
a rail configured to couple to an information handling system installation location, the rail having an upper supporting portion and a lower supporting portion;
a rail clip configured to couple to an information handling system, the rail clip having an upper supporting portion configured to engage with the rail upper supporting portion, the rail clip having a lower supporting portion configured to engage with the rail lower supporting portion;
a sensor disposed at the rail clip lower supporting portion to detect engagement of the rail and the rail clip; and
an extending member disposed at the rail clip upper supporting portion, the extending member extending out of the rail and towards the rail upper supporting portion.

19. The information handling system securing system of claim 18 further comprising:
first and second extending members disposed at the rail clip upper supporting portion; and
a flexible printed circuit integrated in the rail clip to communicate a signal from the sensor to the first and second extending members;
wherein the sensor signals the first and second extending members at engagement of the rail clip lower supporting portion and rail lower supporting portion and at disengagement of the rail clip lower supporting portion and rail lower support portion, the extending members extending at engagement and retracting at disengagement.

20. The information handling system of claim 19 wherein the first and second extending members comprise first and second solenoids.

* * * * *